(12) United States Patent
Cloutier

(10) Patent No.: US 6,668,165 B1
(45) Date of Patent: Dec. 23, 2003

(54) INVERTED SUPER REGENERATIVE RECEIVER

(75) Inventor: Mark Cloutier, Aylmer (CA)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/435,647

(22) Filed: Nov. 9, 1999

(51) Int. Cl.$^7$ ................................................ H04B 1/16
(52) U.S. Cl. ........................ 455/336; 455/341; 330/112; 331/174; 331/175; 331/183
(58) Field of Search ................................ 455/336, 337, 455/338, 341; 330/112, 137, 302–306; 331/1 R, 10, 15, 175, 183, 174

(56) References Cited

U.S. PATENT DOCUMENTS

| 3,883,809 A | * | 5/1975 | Ver Planck et al. | .......... | 455/336 |
| 4,393,514 A | * | 7/1983 | Minakuchi et al. | .......... | 455/336 |
| 5,105,162 A | * | 4/1992 | Fleissner et al. | ............ | 329/359 |
| 5,630,216 A | * | 5/1997 | McEwan | .................... | 455/215 |
| 5,742,902 A | * | 4/1998 | Shore | ......................... | 455/336 |
| 6,057,735 A | * | 5/2000 | Cloutier | ..................... | 330/279 |
| 6,421,535 B1 | * | 7/2002 | Dickerson et al. | .......... | 455/338 |

OTHER PUBLICATIONS

"Selectivity and Sensitivity Performances of Superregenerative Receivers" Vouilloz et al, 1998 IEEE 0–7803–445–3/98/.

"A 2V, 600mA, 1GHz, BiCMOS Super–Regenerative Receiver" Favre et al, ISSCC, 1998, 8.4–1–8.4–10, IEEE 1998.

* cited by examiner

*Primary Examiner*—William Trost
*Assistant Examiner*—James D Ewart

(57) ABSTRACT

An amplifier for high gain, narrowband signal amplification is disclosed. An embodiment is an amplifier including a first means capable of oscillating and a second means for controlling the operating state of the first means between oscillation and close to oscillation. By operating close to oscillator high gain, narrowband signal amplification occurs. By operating between oscillation and close to oscillation, rather than between startup and close to oscillation, the amplifier is always narrowband. Accordingly, an advantage of the invention is operation with minimum affect from interfering.

16 Claims, 10 Drawing Sheets

Classic SRG RF Envelope vs. Time for a Single Quench Cycle

Inverted SRG RF Envelope vs. Time for a Single Quench Cycle

INVERTED SUPER REGENERATIVE RECEIVER

The present invention relates to active filters and more specifically to high gain, narrowband amplifiers

BACKGROUND

Communications systems transmit or receive signals in a portion of the radio frequency spectrum known as a frequency band. Usually, communications systems are forced to operate in close proximity to other bands. From the point of view of the communications system, all other signals can be regarded as interfering signals. Hence, communications systems attempt to use the band of interest while excluding interference from all other bands.

Therefore, most communications systems usually use some form of filter to allow the use of the information in the desired frequency band while excluding all other interference. These filters are often called bandpass filters or band limiting filters, and they may be used in receivers, transmitters, or both. Indeed, band limiting filters may be useful in any electronic system which requires frequency selectivity.

There are a number of desirable characteristics for band limiting filters. Firstly, it is often desirable for band limiting filters to be narrowband, that is, they are required to minimize the undesired information outside the band of interest that is passed by the filter. Sometimes it is also desirable for band limiting filters to provide gain thereby increasing the signal level, since often the communications system either transmits from a lower power signal source or receives a low power signal.

One known implementation of band limiting filters uses all passive components. Filters of this implementation are often known as passive filters. In general, passive filters are known to be implemented with combinations of lumped elements such as inductors and capacitors, or with equivalent distributed resonant structures such as ceramics, crystals, resonant transmission lines, and the like, or with hybrid lumped element structures with partially resonant structures, such as shortened transmission lines with capacitors or inductors added.

A limitation of the passive approach is that passive filters do not provide gain because there is no active element. Furthermore, passive elements will have manufacturing tolerances which, at radio frequencies, can be substantial enough to degrade the frequency performance of the filter. This degradation in frequency performance could result in a filter that is not narrowband enough or may be at the wrong frequency. Additionally, passive structures on a semiconductor substrate in an integrated circuit can be relatively large which may directly affect the cost of the system.

To achieve a signal gain as well as a narrowband response, an active filter is desirable. An active filter contains at least one active element, such as a transistor or diode, to provide a gain. Active filters may be realized as amplifiers where the frequency selectivity is achieved by the quality of the input and output impedance matching. Therefore, the amplifier may provide gain to a narrowband of the frequency spectrum while attenuating other out of band interferers.

A known type of active filter is called a super regenerative receiver. This device alternates itself from completely turned off, through an amplifying state, into an oscillating state. As the device passes through the amplifying state and close to the oscillating state, the amplifying bandwidth narrows. Thus, there is a period of time, after startup, but before the gain of the device saturates and oscillation begins, where the device is capable of narrowband amplification. This operating period, or state, is desirable for band limiting filter operation.

Traditionally, there have been a number of limitations to the super regenerative receiver approach. Firstly, it has been difficult to control the operation of the device during the desirable amplification stage. Specifically, the devices have not been sufficiently controlled so that the desirable amplifier state is maintained close to oscillation. Thus, the devices were usually pulsed on and off. This pulsed mode of operation limits the selectivity of the device due to sampling alias responses, and thus makes the device vulnerable to interference. Secondly, although in the amplifying state the devices can achieve very high sensitivity, they are difficult to tune and are highly non-linear. As a result of these factors, super regenerative receivers have seen limited usefulness in general high performance communications applications.

For the foregoing reasons, there is a need to provide an amplifier for high gain, narrowband signal amplification.

SUMMARY

The present invention is directed to an amplifier for high gain, narrowband signal amplification.

An embodiment of the invention is an amplifier including a first circuit capable of oscillating and a second circuit for controlling the operating state of the first circuit between oscillation and close to oscillation. By operating close to oscillation high gain, narrowband signal amplification occurs. By operating between oscillation and close to oscillation, rather than between startup and close to oscillation, the amplifier is always narrowband.

According to an aspect of the present invention, there is provided an amplifier which includes a first circuit having a variable transconductance part and a frequency control part, and being capable of oscillating to generate an output signal in response to an input signal from an antenna and a controller for controlling the operating state of the first circuit between oscillation and close to oscillation so that high gain, narrowband signal amplification occurs. The controller has a circuit for generating an error signal through a comparison of the output signal of the first circuit and a Q reference level, a first filter for filtering the error signal to hold the first circuit at a desired Q, a circuit for generating a quenching signal of a sample rate for a quenched operation of the first circuit, a circuit for generating a resulting signal through a multiplication of the filtered error signal and the quenching signal and applying the resulting signal to the transconductance part to control transconductance, a circuit for generating a driving signal through a comparison of the output signal of the first circuit and a reference frequency, and a second filter for filtering the driving signal and applying the filtered driving signal to the frequency control part. A filtering bandwidth is narrow relative to the signal bandwidth if the filtering is active during a matched Q portion with the quench cycle.

Preferably, the amplifier further includes a circuit for detecting DC offsets on the output signal of the first circuit and feeding back a correction signal to the output signal of the first circuit to eliminate the DC offsets, and a circuit for detecting data from an output of the DC offsets detecting circuit. The output signal of the first circuit is Manchester encoded, and the feeding back is carried out in a limited bandwidth to less than that of a lowest frequency component of the Manchester encoded data.

Preferably, the amplifier further includes a baseband Q control circuit for inputting the output signal of the first circuit and applying an output signal thereof to the error signal generating circuit to control the Q of the first circuit by using background thermal noise in the baseband filter when the Q of the first circuit is sufficiently high.

Preferably, the error signal generating circuit includes a unit for autocorrelating the output signal of the first circuit, a unit for bandlimiting an output signal of the autocorrelating circuit to restrict the output signal of the autocorrelating circuit to baseband frequency components of the autocorrelation, a unit for setting the Q reference level, and a first comparing unit for comparing the bandlimited output signal and the Q reference level.

Preferably, the error signal generating circuit further includes a charging pump connected between the comparing circuit and the first filter.

Preferably, the first filter is a Q loop filter having an integrator and a differentiator to allow high gain at DC and early loop response to changes in state.

Preferably, the driving signal generating circuit includes a unit for limiting the output signal of the first circuit to removes excessive AM on the output signal of the first circuit, a unit for dividing an output signal of the limiting unit, a unit for controlling the division ratio of an output of the dividing unit so that a divided down signal of the output of the dividing unit equals the reference signal, a unit for generating the reference signal, and a second comparing unit for comparing the output of the dividing unit and the reference signal and generating the driving signal. The AM is reduced to allow the dividing unit to operate continuously.

Preferably, the driving signal generating circuit further includes a unit for dividing the reference signal. The reference signal is divided before the comparison of the output of the dividing unit to the reference signal.

Preferably, the driving signal generating circuit further includes a unit for gating the dividing unit and the reference signal dividing unit in a fashion that, in the off state, the gating unit retains the signals of the dividing unit and the reference signal dividing unit in a frozen fashion until the next gated on-state, to thereby prevent a frequency of the second filter from being jammed or interfered with by large unwanted signals.

Preferably, the driving signal generating circuit further includes a charging pump for converting an output of the second comparing unit into the driving signal to drive the second filter.

Preferably, the limiting unit is a limiter amplifier.

Preferably, the dividing unit is a prescalar circuit.

Preferably, the reference frequency generating unit is a crystal oscillator.

Preferably, the second comparing unit is a phase frequency detector.

Preferably, the second filter has an integrator and a differentiator.

Preferably, the DC offsets detecting circuit includes a low pass filter for filtering the autocorrelated output signal of the first circuit, and a DC reject loop for receiving and feeding back the correction signal to the filtered autocorrelated output signal, to thereby ignore signals present as large oscillating signals.

BRIEF DESCRIPTION OF THE DRAWINGS

These and other features of the invention will become more apparent from the following description in which reference is made to the appended drawings in which.

DETAILED DESCRIPTION

This invention is based upon the idea that an oscillator is a filter with near zero bandwidth and near infinite Q.

Traditionally, a high Q filter as is used in a Super Regenerative Receiver (SRG) is normally modulated from the off state (low Q) to an on-state with closed loop gain greater than unity, such that the filter starts to oscillate.

Figure 1:
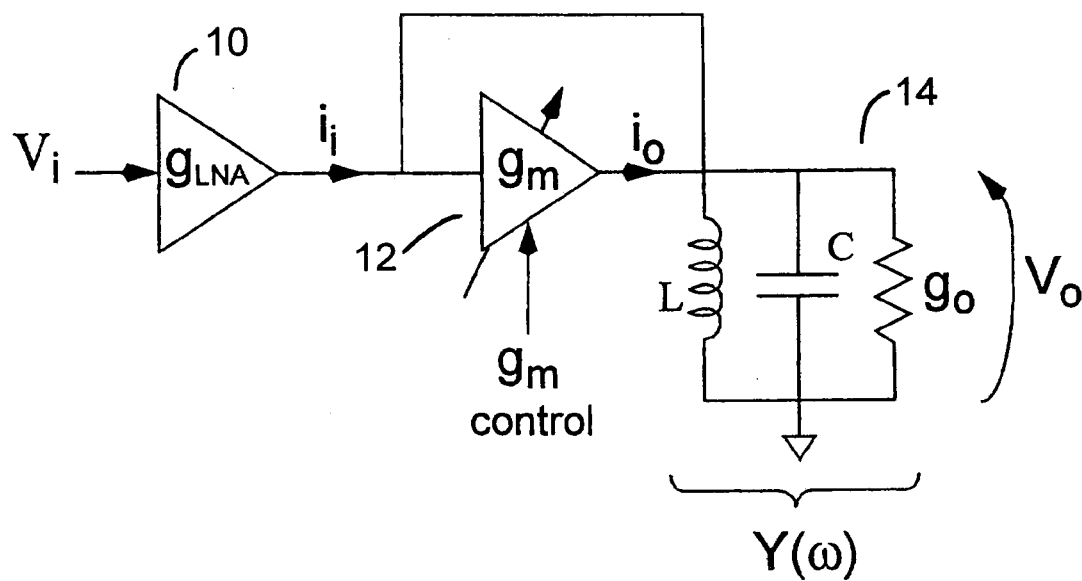
FIG. 1 is a diagram showing a basic Super Regenerative Receiver (SRG)

FIG. 1 is a diagram showing a SRG. The SRG of FIG. 1 includes an input amplifier 10 which receives an input $V_i$, an amplifier 12 which is controlled by a $g_m$ control signal, and a resonator 14 which includes an inductor (L), a capacitor (C), and a resistor ($g_o$). The basic SRG transfer function shows that the gain and Q are a function of the input amplifier transconductance, $g_{LNA}$, and the difference between the open loop transconductance, $g_m$, and the resonator losses represented by $g_o$.

The Q of the active filter can be shown to be related to it's g m and the losses in the resonator, $g_o$, by the following expression:

$$Q = \frac{1}{(g_o - g_m)Z_o}$$

where $$Z_o = \sqrt{\frac{L}{C}}$$

If $g_m > g_o$ then the filter gain grows with time uncontrolled as an oscillator.

The Q of the filter however is defined loosely as the ratio of the dissipated energy per cycle to the energy stored per cycle. Hence we can have a concept of positive and negative Q.

As an example, if 1% of the energy is lost per cycle, the Q of the resonator would be:

$$Q = \frac{1}{1-0.99} = 100$$

The exponential growth time constant, τ, of the signal would be defined by the Q of the SRG, and is approximately given by:

$$\tau = \frac{fo}{Q}$$

Similarly if 1% of the energy per cycle added by the g m were in excess of the energy required to balance the energy dissipated, then we would have a Q given by:

$$Q = \frac{1}{1-1.01} = -100$$

the negative sign has no real meaning as no phase shift is experienced. In both cases the delay of the signal through the filter is the same hence the bandwidth and time constants are the same for the two cases.

Hence we can define a start up time for the oscillator, when $g_o-g_m$ is negative. The time constant of the exponential build up is just $Q/f_o$.

Figure 2:
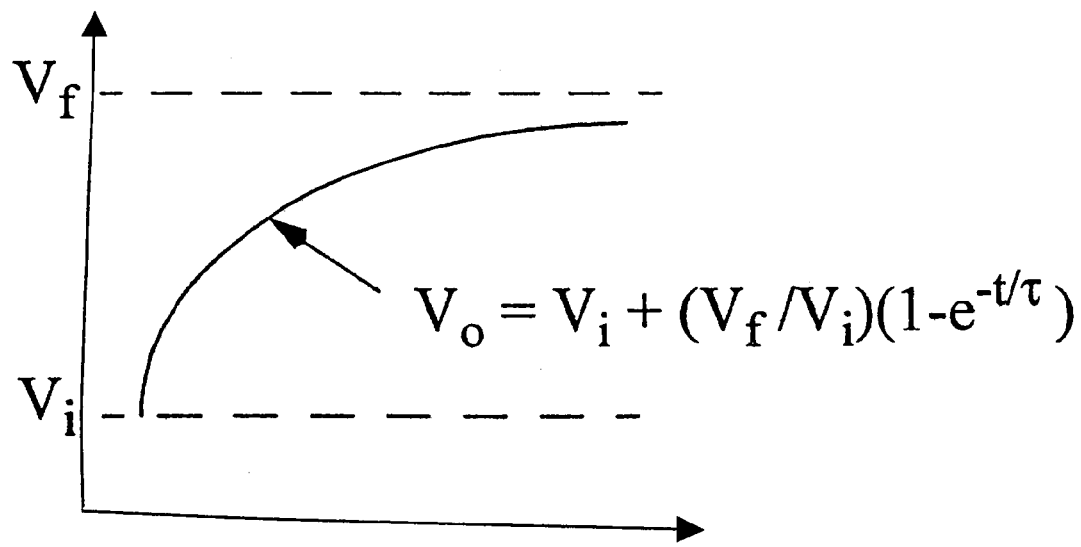
FIG. 2 is a graph showing one example of an output Vo when Q is positive.
Figure 3:
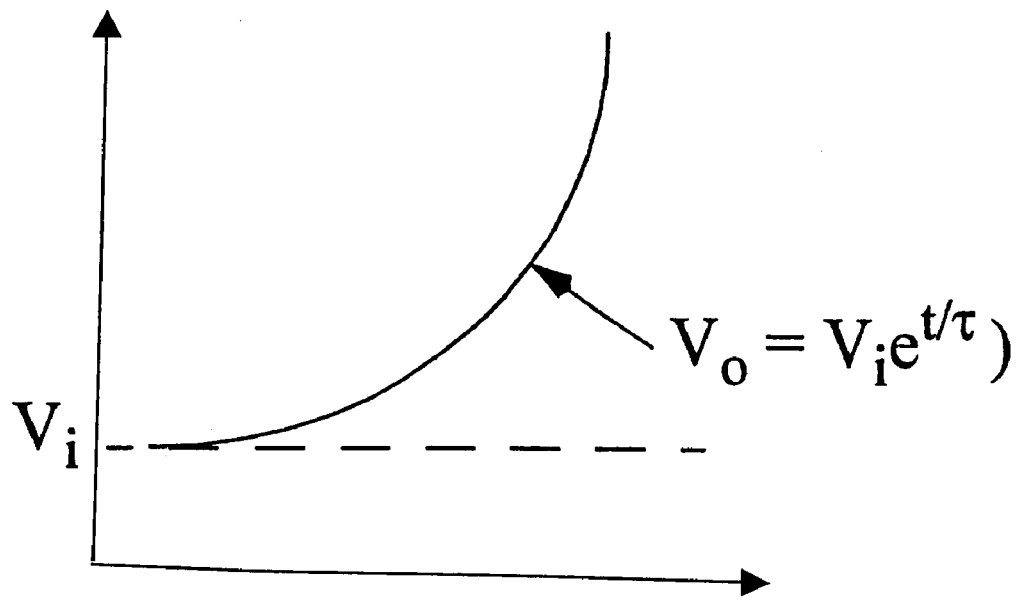
FIG. 3 is a graph showing one example of the output Vo when Q is negative.

FIG. 2 shows the change of the output Vo when Q is positive. FIG. 3 shows the change of the output Vo when Q is negative.

It should be noted that in start up, with g m>g o, the oscillator has both low Q and a fast start up. Hence the oscillation is affected during its start-up by any input signal in its "passband" defined by its Q and the power of the input jamming signal.

As the oscillator reaches saturation non-linear effects such as gain compression reduce the gain of the first harmonic and increase the transfer of power to higher order harmonics. During this phase the fundamental frequency gain continues to drop as the signal energy grows until the sum of the energy gain is all of the harmonics equals the energy dissipated in the loss $g_o$.

When the fundamental gain drops below $g_o$, the oscillator becomes a high gain amplifier, with a very high positive Q. Because the amplifier has natural limiting such that the feedback is almost exactly unity, the bandwidth narrows as the limiting sets in, and the oscillator "filter" narrows to near zero.

The fact that the oscillator "Q" improves as the limiting sets in is a key factor in the operation of the inverted SRG.

A key weakness of classic SRGs has always been that they are subject to interference. This is due to the fact that traditional SRGs starts from near zero initial voltage on each quench cycle, and are biased such that the output voltage rises exponentially in a short period of time.

Figure 4:
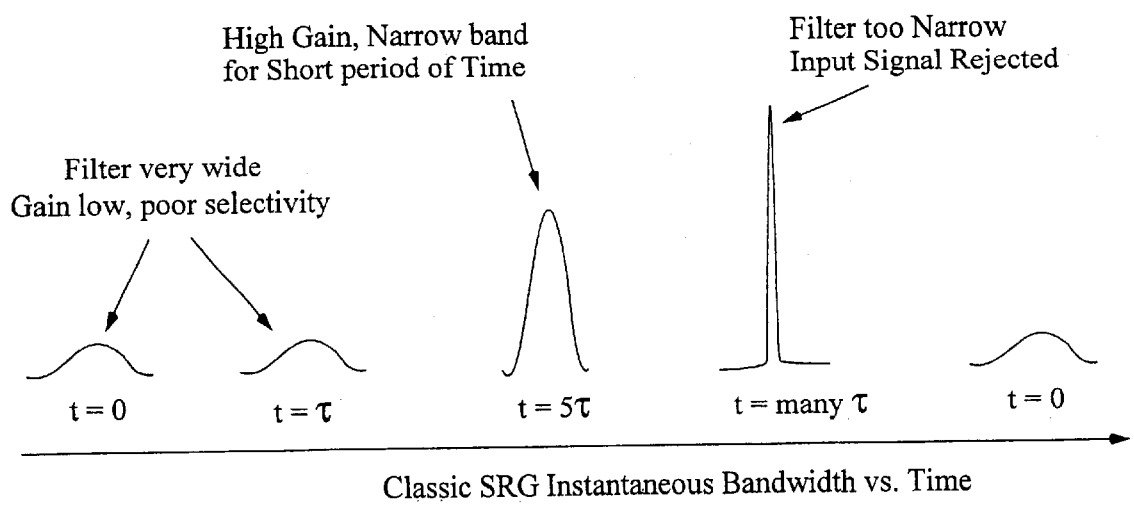
FIG. 4 is a graph showing a classic SRG instantaneous bandwidth vs. time.
Figure 5:
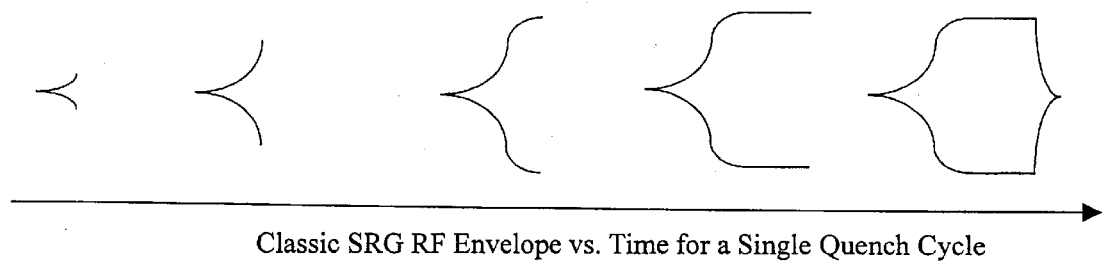
FIG. 5 is a graph showing the classic SRG RF envelope vs. time for a single quench cycle.

FIG. 4 shows the bandwidth vs. time characteristic in a classic SRG. FIG. 5 shows the RF envelop vs. time characteristic for a single quench cycle in the SRG.

Figure 6:
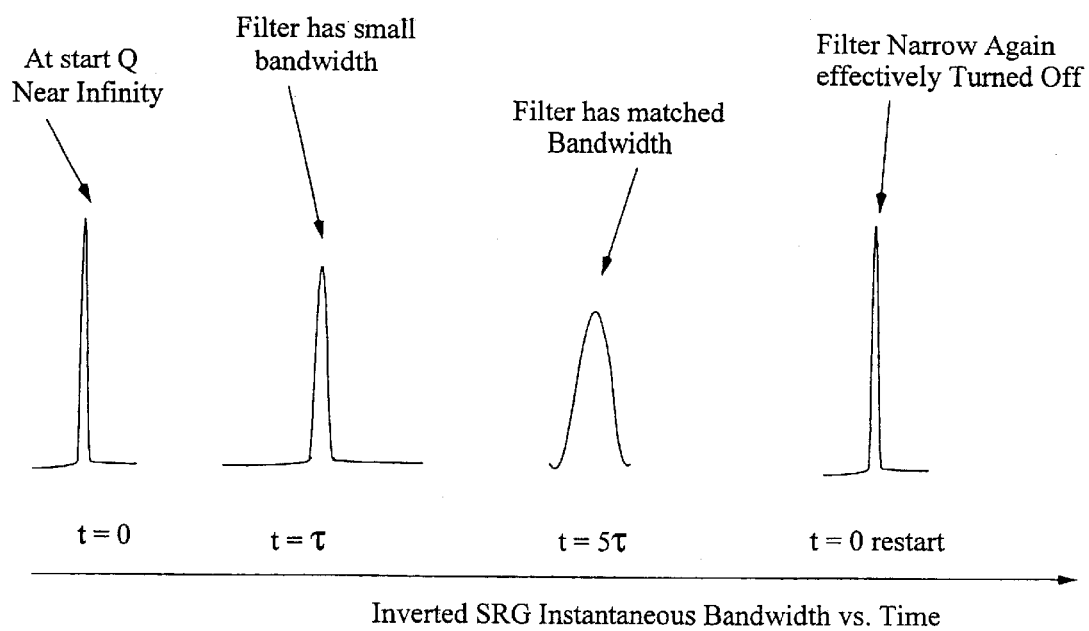
FIG. 6 is a graph showing an Inverted SRG instantaneous bandwidth vs. time in accordance with one embodiment of the present invention.
Figure 7:
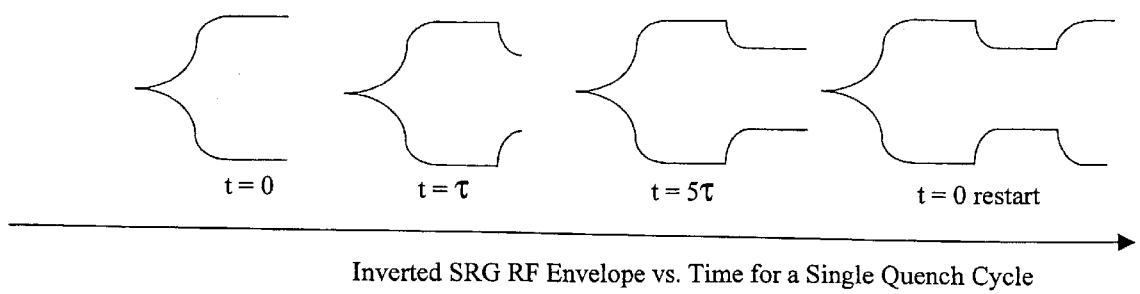
FIG. 7 is a graph showing the Inverted SRG RF envelope vs. time for a single quench cycle.

FIG. 6 shows the bandwidth vs. time characteristic in an Inverted SRG in accordance with an embodiment of the invention (hereinafter referred to as ISRG). FIG. 7 shows the RF envelop vs. time characteristic for a single quench cycle in the ISRG.

The inverted SRG has the major advantage over the classic SRG in that it never opens up its narrowband filter. Hence it represents a major improvement over the state of the art classic SRG.

The classic SRG relied upon the onset of oscillation to sharpen the filter and the gain to very high values. The problem was that the period of time which the SRG spent with passband near the optimum was a very uncontrolled process. If the closed loop could be brought closer to unity then the rise time would be slower and the filter "sweet" spot would be stretched out. Typically this was done with techniques like triangle shaped bias control.

In the inverted SRG (ISRG) a feedback loop is used to hold the bias at the proper level for a matched filter. The gain is then periodically increased to force oscillation. The oscillation phase serves a number of purposes:

1. The oscillation effectively turns off the input from the antenna without altering the input parasitic loading in any way, this allows a frequency measure of the filter centre frequency with no interfering signals present.
2. The high gain oscillation provides a narrow filter amplitude point from which the filter can be slowly relaxed. At the expected gain the output thermal noise is used as a reference to the AGC/Q control loop to effectively hold the bias at the desired Q.
3. As a result of the fact that the Q is momentarily lowered when the oscillation starts, the Q buildup is relatively fast. Also the oscillation phase starts with a relatively large signal present in the loop and hence the exponential buildup is much faster than if the start were from a point with no energy in the loop.

As a result the time spent in oscillation buildup can be relatively short compared to the time spent in the desired high gain state. This approach provides a relatively high duty cycle for the data sampling compared with the classic SRG.

Figure 8:
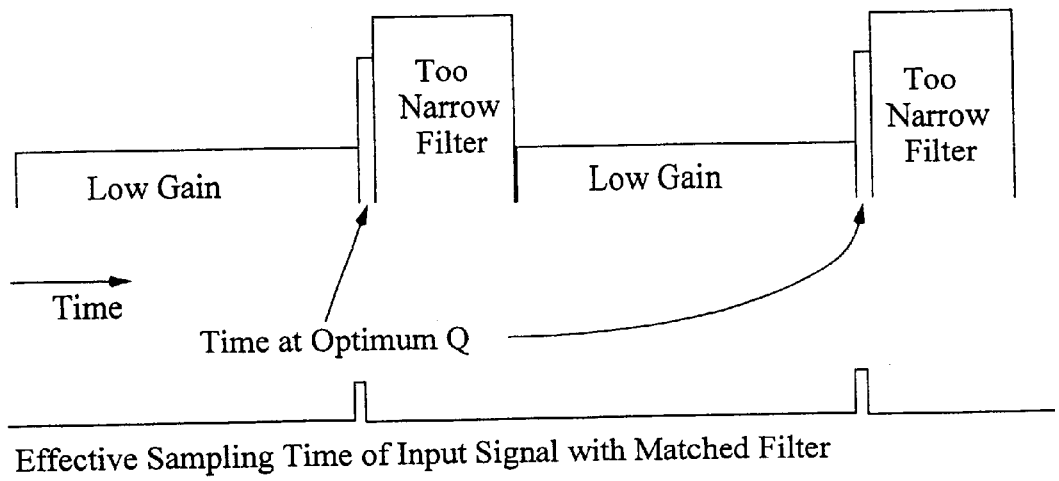
FIG. 8 is a diagram showing a sampling timing of a practical basic SRG.

FIG. 8 shows the effective sampling time of an input signal with a matched filter in a practical basic SRG.

Figure 9:
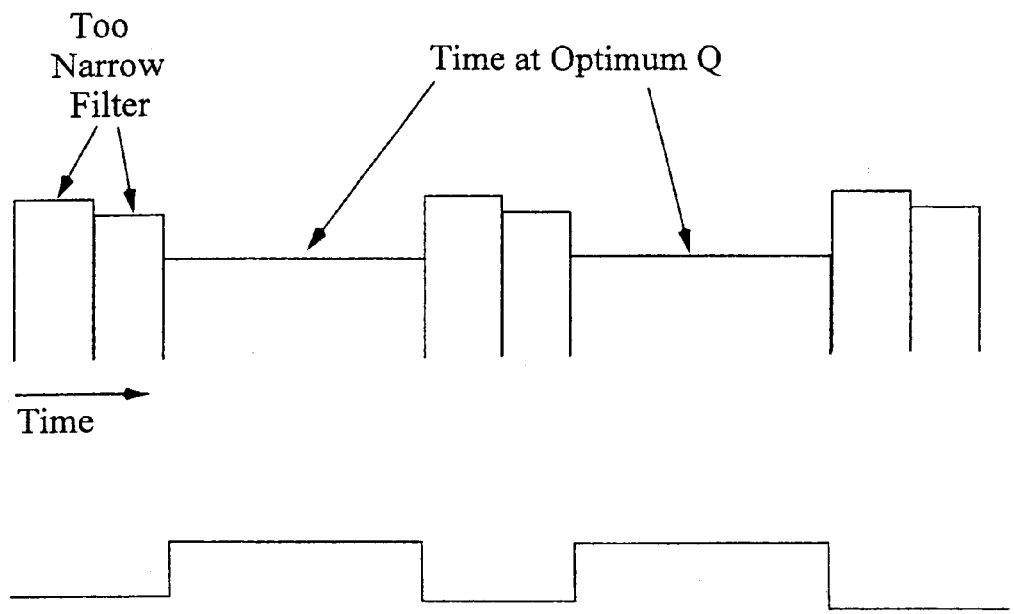
FIG. 9 is a diagram showing a sampling timing of a practical Inverted SRG.

FIG. 9 shows the effective sampling time of an input signal with a matched filter in an ISRG.

Figure 10:
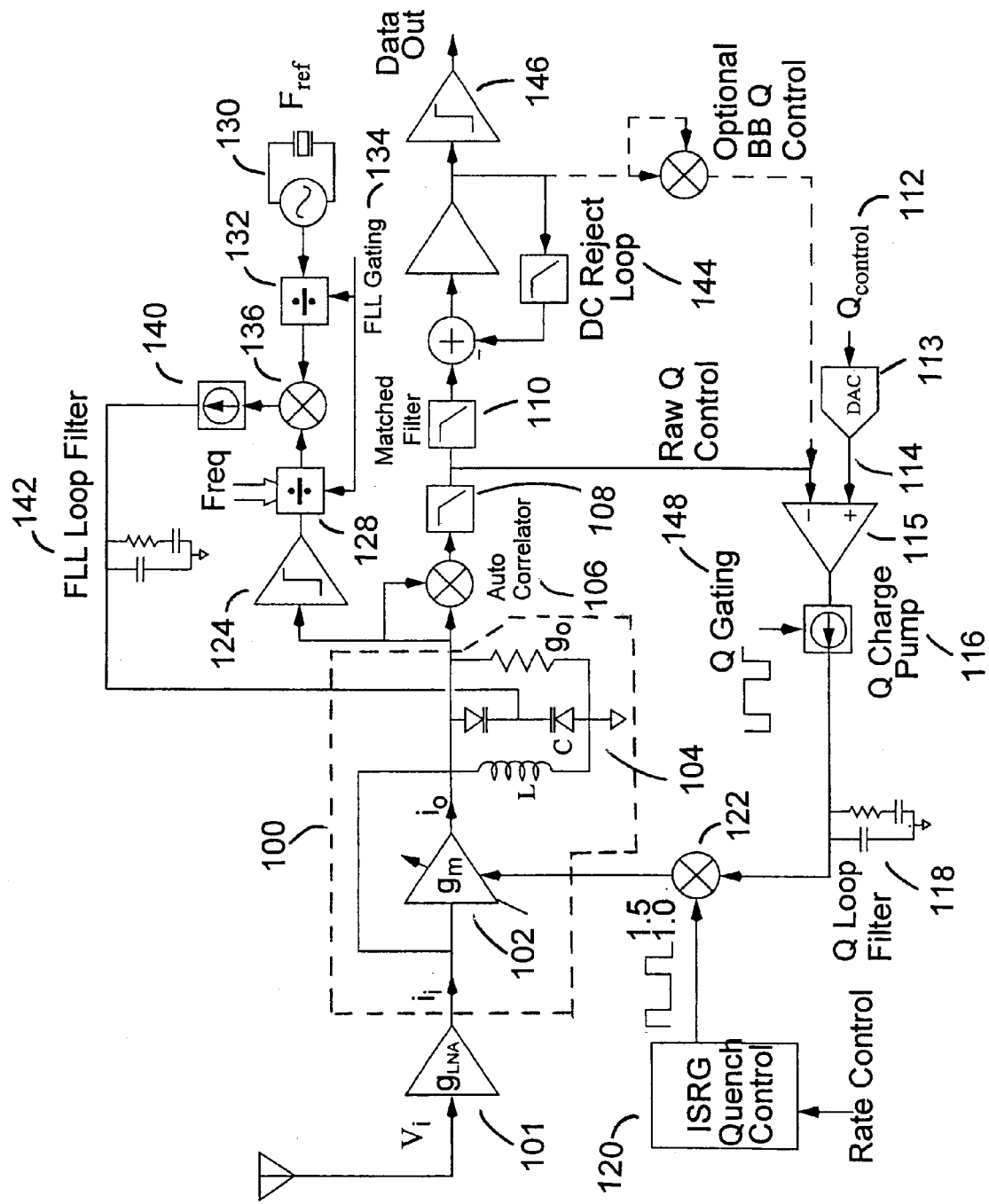
FIG. 10 is a diagram showing one example of the practical integrated semiconductor embodiment of an Inverted SRG.

FIG. 10 is a diagram showing one example of a practical integrated semiconductor embodiment of an ISRG.

The ISRG of FIG. 10 includes an input low noise amplifier 101 with high impedance output, and a positive feedback resonant circuit 100, referred to as "KT Cell" with variable frequency and transconductance. A circuit 102 controls the transconductance of the KT Cell 100. A circuit 104 controls the centre frequency of the KT Cell 100. The KT Cell 100 can have many possible implementations including cells with high Q resonators and cells like Ring oscillators which rely solely on feedback control for high Q.

The ISRG further includes an autocorrelator 106 for autocorrelating the output of the KT Cell 100, and a circuit 108 for bandlimiting the output of the autocorrelator 106 to restrict the output of the autocorrelator 106 to the base-band frequency components of the autocorrelation.

A DAC 113 receives a Q control signal 112 to set a Q reference level 114. The ISRG further includes a comparing circuit for comparing the Q reference level 114 with the output of the filtered autocorrelator to create an error signal. In FIG. 10, the comparing circuit has a comparator 115 and a charge pump 116.

The error signal is filtered in a Q loop filter 118. The preferred loop filter features both an integrator and a differentiator to allow high gain at DC and early loop response to changes in state. The preferred Q loop filter type is the same as is commonly used in a phase locked loop. In locked state the voltage on the Q loop filter 118 represents the value needed to hold the KT Cell 100 at the desired Q.

The ISRG further includes an ISRG quench controller 120 for generating a sampling rate for the "quenched" operation of the ISRG, and a circuit 122 for multiplying the loop filter output from the desired Q value on the loop filter to essentially an oscillating state. The multiplication should be done at the rate of the quenching signal and the proportion of the oscillating state to desired Q state should be controlled by a circuit which sets the duty cycle of each state. The resulting signal is applied to the transconductance control line of the KT Cell 100.

The output of the KT Cell 100 is applied to a limiter amplifier 124 which removes excessive AM on the waveform. The output of the limiter 124 is applied to a prescalar circuit 128. The AM on the waveform should be reduced as to allow the prescalar 128 to operate continuously.

The ISRG controls the division ratio of the prescalar 128 such that the divided down signal equals the divided version of a reference signal. This portion of the circuit functions like a low bandwidth phase locked loop. If the bandwidth is severely restricted in the loop it is referred to as an FLL. In FIG. 10, the ISRG includes a generator 130 for generating a reference frequency, preferably from a crystal oscillator. The output of the crystal oscillator may be divided by a divider 132 before comparing with the prescalar output but this is not essential. The step size of the KT Cell 100 is controlled in a fashion analogous to a normal phase locked loop circuit.

The prescalar 128 and the crystal oscillator divider 132 are gated using a FLL gating 134, in a fashion such that in the off state the gated circuits retain their signals in a frozen fashion, until the next gated on-state. The gating can be controlled in a fashion that the FLL is only sampled when the KT Cell 100 is in the oscillating state. This would ensure that the frequency of the control loop cannot be jammed or interfered with by large unwanted signals. This circuit is only necessary when the desired signal is small in the presence of large unwanted signals. This is however often the case in a radio.

The ISRG includes a circuit 136 for comparing the prescalar output and the reference output, which may be in a phase frequency detector or equivalent circuit, and a converter for converting the result to a driving signal for a FLL loop filter 142. Preferably, a charge pump 140 is used to drive the FLL loop filter 142.

The output of the charge pump 140 is filtered in the loop filter 142. The preferred loop filter has both integrator and differentiator as is common in phase locked loops. The bandwidth of the FLL however should be narrow relative to the signal bandwidth if the FLL loop is active during the matched Q portion of the quench cycle.

The output of the FLL loop filter 142 is applied to the frequency control circuit 104 of the KT Cell 100. The frequency control circuit 104 may have an LC tank circuit in the KT Cell 100 with the "C" realized by varactor diodes or other variable capacitance devices.

The output of the autocorrelator 106 is applied to the low pass filter 108. In order for the signal to respond properly the input signal should be Manchester encoded. That is the autocorrelation requires a strong carrier component to properly centre the data in the matched filter 110. The low pass filter 108 should have sufficient gain to allow the proper operation of the follow on comparator. A typical value of gain required is 40 dB.

The ISRG detects DC offsets on the output of the low pass filter 108 and feedbacks a correction signal which eliminates the DC offsets (e.g. DC reject loop 144). The feedback loop 144 should have a limited bandwidth to less than that of the lowest frequency component of the Manchester encoded data. The ISRG detects the data using a threshold comparator 146.

In the event of large interference it is also possible to add a signal detector on the output of the matched filter 110. When the Q of the KT Cell 100 is sufficiently high the background thermal noise in the baseband filter will be measurable and can be used to control the gain in the passband directly. The baseband Q control is an optional system and method to the raw Q control system and method to control the Q of the KT Cell 100.

The Q charge pump 116 can be gated off using a Q gating 148 when the loop is in the oscillation state. This allows the loop filter to "coast" during the oscillation stage and ignore the high level of "DC" seen during this state. As such the value in the loop filter always reflects the desired "high Q" voltage.

Assuming that the on-state Q is high enough to drive the frequency locked loop (FLL) (124–142), then the frequency tuning loop can be left on 100% of the time. This avoids the need for a mirrored cell and provides excellent frequency stability.

If the filter is subjected to large jamming or interfering signals which would tend to drive the FLL and Q loops away from their steady state values, then the FLL loop can be gated to service the loop filter only when the filter is oscillating, thus avoiding frequency detuning from the jamming signal. This implementation constitutes a sampled FLL in this case it is necessary to sample both the VCO path and the reference path with identical duty cycles. The gating signal is preferably asynchronous to the reference signal to avoid a constant bias in the frequency sampling.

Similarly if the jamming signal amplitude is sufficiently high then the Q control loop (114–122) would tend to reduce the gain and hence reduce the selectivity of the receiver, exactly the worst thing to do in the presence of a large jamming signal. Two possible systems and methods are presented to avoid the influence of large interfering signals. In the first system and method it will be possible with the Inverted SRG to use only the oscillating phase as a reference and to operate effectively "open loop" by relaxing the Q control to some pre-determined state, which would not be affected by the jammer. If the Q control were under control of a microprocessor, serial port, and a DAC, then the Q control could be progressively relaxed until the point that the signal was received, and no lower. This would ensure that the smallest possible bandwidth was maintained even in the presence of a jammer.

In a second preferred system and method the Q reference is taken from the output of the baseband matched filter. In this system and method only the coherent sideband is used to measure the Q. The Q control loop using this system and method would tune for a required background noise level in the baseband filter which would indicate a certain Q. When a coherent signal arrives the signal will pass through the baseband filter with the preset Q and RF gain. The baseband Q control assures the optimum Q with minimum interference from undesired signals as the front end signal is kept very narrow at all times.

If the Q control were under control of a microprocessor, serial port, and a DAC, then the Q control could be progressively relaxed until the point that the signal was received, and no lower. This would ensure that the smallest possible bandwidth was maintained even in the presence of a jammer.

Some advantages of the inverted SRG are:
1. The inverted SRG allows the SRG to operate without affect from interfering signals, hence the Q control can be optimized without interference.
2. The baseband Q control system and method allows very precise Q control based only on the component of the signal in the passband, not on the entire baseband component of the RF autocorrelated signal. This enhances the precision of the SRG.
3. The sampled frequency control loop allows near perfect frequency tuning of the KT Cell filter without any interference from the jamming signals.
4. The precision of the two FLL and Q control loops together with crystal controlled frequency allows a much higher performance radio than can be achieved with a classic SRG.

5. The use of a DC reject loop at baseband allows the receiver to ignore signals which are always present such as the large oscillating signal in the ISRG mode. This system and method allows the receiver to pass only the modulated signals in the matched filter bandwidth.

Numerous modification, variations and adaptation may be made to the particular embodiments of the invention described herein, without departing from the scope of the invention, which is defined in the claims.

What is claimed is:

1. An amplifier comprising:
   a first circuit having a variable transconductance part and a frequency control part, and being capable of oscillating to generate an output signal in response to an input signal from an antenna; and
   a controller for controlling the operating state of the first circuit between oscillation and close to oscillation so that high gain, narrowband signal amplification occurs, having:
      a circuit for generating an error signal through a comparison of the output signal of the first circuit and a Q reference level;
      a first filter for filtering the error signal to hold the first circuit at a desired Q;
      a circuit for generating a quenching signal of a sample rate for a quenched operation of the first circuit;
      a circuit for generating a resulting signal through a multiplication of the filtered error signal and the quenching signal and applying the resulting signal to the transconductance part to control transconductance;
      a circuit for generating a driving signal through a comparison of the output signal of the first circuit and a reference frequency; and
      a second filter for filtering the driving signal and applying the filtered driving signal to the frequency control part, a filtering bandwidth being narrow relative to the signal bandwidth if the filtering is active during a matched Q portion with the quench cycle.

2. The amplifier as recited in claim 1, further comprising:
   a circuit for detecting DC offsets on the output signal of the first circuit and feeding back a correction signal to the output signal of the first circuit to eliminate the DC offsets, the output signal of the first circuit being Manchester encoded, and the feeding back being carried out in a limited bandwidth to less than that of a lowest frequency component of the Manchester encoded data; and
   a circuit for detecting data from an output of the DC offsets detecting circuit.

3. The amplifier as recited in claim 1 further comprising a baseband Q control circuit for inputting the output signal of the first circuit and applying an output signal thereof to the error signal generating circuit to control the Q of the first circuit by using background thermal noise in the baseband filter when the Q of the first circuit is sufficiently high.

4. The amplifier as recited in claim 1, wherein the error signal generating circuit includes:
   a unit for autocorrelating the output signal of the first circuit;
   a unit for bandlimiting an output signal of the autocorrelating circuit to restrict the output signal of the autocorrelating circuit to baseband frequency components of the autocorrelation;
   a unit for setting the Q reference level; and
   a first comparing unit for comparing the bandlimited output signal and the Q reference level.

5. The amplifier as recited in claim 4, wherein the DC offsets detecting circuit includes:
   a low pass filter for filtering the autocorrelated output signal of the first circuit; and
   a DC reject loop for receiving and feeding back the correction signal to the filtered autocorrelated output signal, to thereby ignore signals present as large oscillating signals.

6. The amplifier as recited in claim 4, wherein the error signal generating circuit further includes a charging pump connected between the comparing circuit and the first filter.

7. The amplifier as recited in claim 1, wherein the first filter is a Q loop filter having an integrator and a differentiator to allow high gain at DC and early loop response to changes in state.

8. The amplifier as recited in claim 1, wherein the driving signal generating circuit includes:
   a unit for limiting the output signal of the first circuit to removes excessive AM on the output signal of the first circuit;
   a unit for dividing an output signal of the limiting unit, the AM being reduced to allow the dividing unit to operate continuously;
   a unit for controlling the division ratio of an output of the dividing unit so that a divided down signal of the output of the dividing unit equals the reference signal;
   a unit for generating the reference signal; and
   a second comparing unit for comparing the output of the dividing unit and the reference signal and generating the driving signal.

9. The amplifier as recited in claim 8, wherein the driving signal generating circuit further includes a unit for dividing the reference signal, the reference signal being divided before the comparison of the output of the dividing unit to the reference signal.

10. The amplifier as recited in claim 9, wherein the driving signal generating circuit further includes a unit for gating the dividing unit and the reference signal dividing unit in a fashion that, in the off state, the gating unit retains the signals of the dividing unit and the reference signal dividing unit in a frozen fashion until the next gated on-state, to thereby prevent a frequency of the second filter from being jammed or interfered with by large unwanted signals.

11. The amplifier as recited in claim 10, wherein the driving signal generating circuit further includes a charging pump for converting an output of the second comparing unit into the driving signal to drive the second filter.

12. The amplifier as recited in claim 8, wherein the limiting unit is a limiter amplifier.

13. The amplifier as recited in claim 8, wherein the dividing unit is a prescalar circuit.

14. The amplifier as recited in claim 8, wherein the reference frequency generating unit is a crystal oscillator.

15. The amplifier as recited in claim 8, wherein the second comparing unit is a phase frequency detector.

16. The amplifier as recited in claim 1, wherein the second filter has an integrator and a differentiator.

* * * * *